United States Patent [19]

Brajder

[11] 4,423,457
[45] Dec. 27, 1983

[54] OVERLOAD PROTECTION CIRCUIT FOR A SEMICONDUCTOR SWITCH

[75] Inventor: Antonio Brajder, Erlangen, Fed. Rep. of Germany

[73] Assignee: Siemens Aktiengesellschaft, Berlin and Munich, Fed. Rep. of Germany

[21] Appl. No.: 343,966

[22] Filed: Jan. 29, 1982

[30] Foreign Application Priority Data

Feb. 5, 1981 [DE] Fed. Rep. of Germany ....... 3104015

[51] Int. Cl.³ .............................................. H02H 3/26
[52] U.S. Cl. ....................................... 361/86; 361/91; 361/98
[58] Field of Search ....................... 361/79, 86, 88, 89, 361/91, 94, 98, 100, 101, 152; 330/207 P, 298

[56] References Cited

U.S. PATENT DOCUMENTS

| | | | |
|---|---|---|---|
| 3,449,598 | 6/1969 | Wright et al. ....................... | 307/202 |
| 3,924,158 | 12/1975 | Farnsworth ....................... | 361/98 X |
| 4,355,341 | 10/1982 | Kaplan ............................... | 361/86 X |
| 4,363,068 | 12/1982 | Burns ................................. | 361/91 |

OTHER PUBLICATIONS

"Elektronik-Selbstbaupraktikum", 4th Edition, 1976 p. 292, by Wirsum.
Etz-b, vol. 30 (1978), No. 26, p. 1065.
"Current and Power Limiter Protects Switching Transistor" Electronics, vol. 40, No. 12, Jun. 12, 1975 by Stitt.

*Primary Examiner*—Harry E. Moose, Jr.
*Attorney, Agent, or Firm*—Kenyon & Kenyon

[57] ABSTRACT

An overload protection circuit for a semiconductor switch has an control line which can be shorted, via the collector-emitter path of a transistor, to the ground. The base of the transistor is connected to the output of a comparison stage. One input of the comparison stage is connected via a resistor to the control line, via a diode to the lead of the semiconductor switch facing away from the ground potential, and via a capacitor to ground. A fixed reference voltage is applied to the second input of the comparator stage.

In this circuit, a control pulse is shorted as soon as the voltage across the semiconductor switch exceeds a given value because of overcurrent. The short circuit of the addressing pulse is cancelled again as soon as the latter goes back to zero.

2 Claims, 2 Drawing Figures

OVERLOAD PROTECTION CIRCUIT FOR A SEMICONDUCTOR SWITCH

This invention relates to an overload protection circuit for a semiconductor switch. More particularly, the invention relates to such a circuit in which the drive is connected via the collector-emitter path of a transistor to ground (reference) potential and the base of the transistor is connected to the output of a device which detects overloading of the semiconductor switch.

Such an overload protection arrangement is described in the book "Elektronik-Selbstbaupraktikum" (electronics do-it-yourself laboratory practise), 4th Edition, 1976, page 292, by Wirsum. There, an overload is detected by the voltage drop across a resistor placed in the switching circuit of the semiconductor switch. If the voltage drop across this resistor exceeds a certain magnitude, the transistor is switched into conduction and the control line of the semiconductor switch is short-circuited to ground. As a result, the semiconductor switch no longer receives the control signal and switches to the open condition. The resistance in the load circuit, however, causes considerable losses, particularly in equipment for larger currents, and this has a negative effect on the efficiency of the semiconductor switch as well as bringing with it problems with respect to the cooling of the resistor.

In another overload protection arrangement described in the journal ETZ-B, vol. 30 (1978), no 26 at page 1065, the voltage drop across the semiconductor switch, in this case a transistor, is evaluated as a criterion for the overcurrent. There, a driver transistor preceding the semiconductor switch is driven via a capacitor. As soon as the voltage at the semiconductor switch drops in response to the drive, a voltage which keeps the latter in the conducting state is fed to the driver transistor via a differential amplifier. The circuit arrangement thereby goes into "on" condition in a self-holding state. If the voltage present at the semiconductor switch increases due to overcurrent, the driver transistor, and thereby also the semiconductor switch, is shut off again via the differential amplifier. To switch off the semiconductor switch, the control line is connected, via a diode, to the input of the differential amplifier which cuts off the driver transistor as soon as the control signal is switched to "high." With this circuit arrangement, however, only dynamic drive via a capacitor is possible and the result is that short interference pulses can lead to malfunction.

It is an object of the present invention, therefore, to provide overload protection circuit of the above-mentioned type in which a resistor is not necessary in the power circuit of the semiconductor switch and in which static addressing is possible.

SUMMARY OF THE INVENTION

According to the present invention, this problem is solved by providing a comparator stage in the overload detection device which has a first input connected via a resistor to the control line of a semiconductor switch, via a diode to the lead of the semiconductor switch which faces away from ground, and via a first capacitor to ground. The second input of the comparator stage is connected to a reference voltage source. The output of the comparator stage is connected to the base of the control transistor.

With this circuit, the control transistor blocks a control signal only when the signal on the control line line coincides with a high voltage at the semiconductor switch. After the control signal disappears, the transistor goes into the cutoff state so that a recurring control signal is not blocked and the semiconductor switch can be again switched into the conducting state. In order to prevent the overload protection arrangement from responding in the time interval between the occurrence of the addressing signal and the complete closing of the semiconductor switch, the first input of the comparator state is connected to ground via the first capacitor so that the voltage rise which causes the transistor to become conducting is damped. This overload protection arrangement therefore needs no resistor in the load circuit of the semiconductor switch amd makes static addressing of the semiconductor switch possible.

Advantageously, the resistor is shunted by a diode, the cathode of which is coupled to the control line so that the capacitor is discharged quickly when the addressing signal goes to zero. In this way, when the semiconductor switch is being closed, the existence of a residual charge on the capacitor, shortly after the switching-off process, which could lead to a response of the overload protection arrangement without overcurrent before the semiconductor switch is fully switched into conduction, is prevented.

A resistor can be arranged parallel to the diode and a second capacitor arranged in series with the parallel circuit of the diode and the resistor which has a larger capacitance than the first capacitor. This is advantageous particularly if, when the semiconductor switch is opened, the voltage on the control line does not at first quite go to zero, or if the source of the control pulse has a high resistance. In these cases, fast discharge of the first capacitor is not directly possible and the problems described above can arise. This is prevented by the second capacitor which is charged when a positive control pulse is present. When the control pulse disappears, the voltage at the control line drops and the electrode of the second capacitor nearest to the first capacitor assumes a negative potential, leading to a fast charge transfer from the first capacitor to the second capacitor via the diode.

According to a further advantageous aspect of the present invention, the collector of the control transistor is connected to a supply potential which is negative with respect to the reference potential and the base of the transistor is connected, via a diode, to the control line and, via this diode and a resistor, to the negative supply potential. In this way, when the control pulse disappears, the semiconductor switch experiences a switching-off current which flows through the transistor in the opposite direction to the switching-on current and thus accelerates the switching-off process.

DETAILED DESCRIPTION OF THE INVENTION

Figure 1:
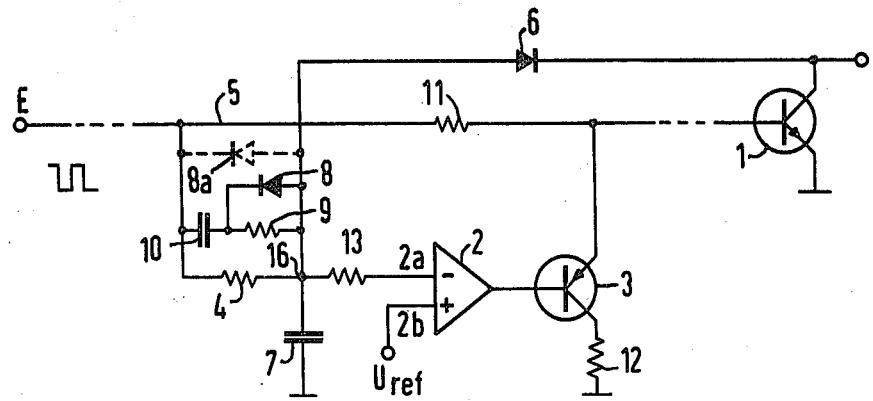
FIG. 1 is a schematic diagram illustrating an overload protection circuit fabricated in accordance with the teachings of the invention.

FIG. 1 shows a schematic circuit diagram of an control device for a semiconductor switch 1 which uses a switching transistor in an overload protection circuit according to the invention. A control signal is applied to input terminal E which is coupled to the base of switching transistor 1. If required, several preamplifier stages can be used which are not shown. In this circuit, switching transistor 1 can be switched into conduction by the application of a positive control signal. The overload protection circuit can be located in a multi-stage preamplifier unit at any point in control line 5, as indicated by the dashed portions of line 5. The overload protection circuit contains transistor 3 which connects control line 5 to reference potential via series-connected resistor 12. Resistor 11 is inserted into control line 5 between input terminal 12 and the connection of line 5 to transistor 3. The base of transistor 3 is addressed by differential amplifier 2 which serves as a comparison stage. A constant reference voltage $U_{ref}$ is present at non-inverting input 2b of differential amplifier 2. Resistor 13 couples inverting input 2a, via junction 16 and diode 6, to the collector of switching transistor 1. Junction 16 is also connected, via resistor 4, to address line 5, and via capacitor 7 to ground. The cathode of diode 6 is connected to the collector of switching transistor 1. Resistor 4 is shunted by a series circuit consisting of second capacitor 10 and resistor 9. Resistor 9 is shunted by diode 8; the anode of diode 8 faces input 2a of differential amplifier 2.

To explain the circuit, it is first assumed that transistor 1 is addressed by a positive drive pulse applied at input E and that transistor 1 is conducting and carries no overcurrent. In this case, the voltage at junction point 16 between resistor 4 and diode 6 has a value which is determined by the residual voltage of transistor 1 and the threshold value of diode 6. This voltage is coupled via resistor 13 to inverting input 2a of differential amplifier 2. The reference voltage $U_{ref}$ is chosen so that, in this operating state, transistor 3 remains cut off. If, however, transistor 1 now carries a current which exceeds the saturation current, the voltage across it rises and, therefore, the voltage at junction point 16 between resistor 4 and diode 6, rises as well. This leads to a negative output voltage at the output of differential amplifier 2, which brings transistor 3 into the conducting state. The drive pulse for transistor 1 is thereby short-circuited, and transistor 1 is cut off. Since the voltage at transistor 1 continues to rise, the drive pulse remains short-circuited behind resistor 11 as long as a positive drive pulse is present at input E. Input E continues to be effective for control of switching off because of resistor 11 in control line 5. However, when the drive pulse at input E disapears, the voltage at junction point 16 also drops, since the positive voltage at transistor 1 is blocked by diode 6. Transistor 3 is again brought into the cutoff state via differential amplifier 2, and the short circuit of control line 5 is cancelled. This is of particular importance because now semiconductor switch 1 can be switched on again by a new positive drive pulse, for instance, after the cause of the overcurrent has been eliminated. Without capacitor 7, the arrival of a new positive drive pulse at input E would cause a high voltage to develop at input 2a of differential amplifier 2, since a high voltage is still present at switching transistor 1 because of the initially still prevailing state of cutoff. In order to prevent immediate short-circuiting of the drive pulse again, capacitor 7 is provided for damping the voltage rise at input 2a of differential amplifier 2. The time constant of the R-C member formed by resistor 4 and capacitor 7 is made sufficiently large for the switching transistor 1 to be reliably in conduction before the voltage present at capacitor 7 causes transistor 3 to be switched on.

If switching-on and -off operations follow each other at short intervals, it is possible for capacitor 7, at the time of switching-on, to retain a relatively large charge from the previous "on" state and therefore to insufficiently damp the voltage rise at input 2a of differential amplifier 2. When on- and off-switching periods can occur at short intervals following each other, care must be taken to discharge capacitor 7 quickly. This can be accomplished in the simple case by connecting diode 8a between address line 5 and capacitor 7, as indicated by the dashed lines in FIG. 1, the diode being poled to conduct for the discharge of capacitor 7. However, for all switching actions it is not assured that the voltage present at address line 5 drops fast enough when transistor 1 is switched off, and that this line provides a sufficiently low-resistance discharge path. In order to insure that a fast discharge of capacitor 7 occurs in these cases, capacitor 10 is placed in series with the parallel circuit of resistor 9 and diode 8. Thus, upon the occurrence of a positive drive pulse, the electrode of capacitor 10 which is coupled to control line 5 is charged positive, and the electrode of capacitor 10 facing the resistor is carried negative, since the potential at point 16 is below the potential of control line 5. If the potential at the control line 5 now drops with the disappearance of the drive pulse, junction point 16 obtains a negative potential from capacitor 10 via diode 8 which leads to a fast discharge of capacitor 7 via diode 8 to capacitor 10. The capacitance of capacitor 10 must be substantially larger than that of capacitor 7, for instance, ten times as large. In this way, a substantial rise of the voltage at capacitor 10, when the capacitor 7 is discharged, is prevented. Capacitor 10 is discharged again via resistors 4 and 9.

Figure 2:
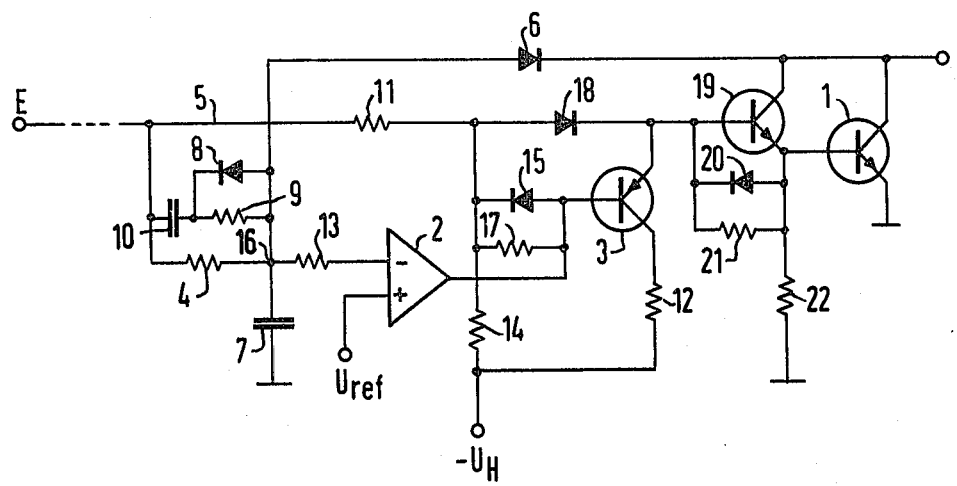
FIG. 2 shows a modification of the circuit of FIG. 1 in which the control transistor is also used for switching off in the event of an overload.

FIG. 2 shows a circuit in which the switching-off of switching transistor 1 is accelerated when the drive pulse disappears by the taking up by transistor 3 of the switching-off current which flows in the direction opposite to the switching-on current. The charge carriers from the base of switching transistor 1 are thereby cleared out. Such fast switching-off of an output switching transistor is described in DE-OS 26 44 507 at pages 2 and 3. Transistor 3 is connected to a negative supply voltage $-U_H$ via resistor 12. The base of transistor 3 is connected to the output of differential amplifier 2, and, via diode 15 and shunt-connected resistor 17, to address line 5. The anode of diode 15 is coupled to the base of transistor 3. A diode 18 is inserted into control line 5, being connected between the connecting point of the parallel circuit of diode 15 to resistor 17 and the point of the emitter of transistor 3 to control line 5, being connected so as to conduct for positive drive pulses and inserted into addressing line 5. Parallel-connected diode 15 and resistor 17 are also connected to the negative supply voltage $-U_H$ via further resistor 14.

In the circuit of FIG. 2, switching transistor 1 is preceded by a preamplifier stage which includes a transistor 19. The base of transistor 19 is connected to addressing line 5 (via diode 18), the collector of transistor 19 is connected to the collector of switching transistor 1, and the emitter of transistor 19 is connected via resistor 22 to the ground potential of the circuit. In addition, a parallel circuit consisting of resistor 21 and diode 20 is connected between the base and the emitter of transistor 19, with the cathode of the diode facing the base of transistor 19.

In this circuit, transistor 3 is biased in the cutoff direction for a positive drive pulse by resistor 17. If, however, the drive pulse goes to zero or to a negative value, transistor 3 is switched into conduction via diode 15 and can therefore take up a switching-off current which flows in the direction opposite to the switching-on current. If switching transistor 1 is directly connected as first described, the base zone of switching transistor 1 will be cleaned out immediately and very effectively via transistor 3. If switching transistor 1 is preceded, as shown in FIG. 2, by one or more amplifier stages such as transistor 19, the amplifier stage can be shunted by one or more diodes 20 which allow the base zone of switching transistor 1 to be cleaned out via transistor 3. With the circuit arrangement of FIG. 2, therefore, transistor 3 is utilized for switching-off in the event of an overcurrent as well as for switching-off in normal operation.

What is claimed is:

1. An overload protection circuit for a semiconductor switch, the semiconductor switch having a control input, a connection to ground, and a third lead, the overload protection circuit comprising:

a control line coupled to the control input of the semiconductor switch;

a transistor having a base and a collector-emitter path coupled between the control line and ground;

a comparison stage for detecting an overload, the comparison stage having a first input, a second input and an output, the first input of the comparison stage being coupled via a resistor to the control line of the semiconductor switch, via a diode to the third lead of the semiconductor switch, and via a first capacitor to ground; the second input of the comparison stage being coupled to a reference voltage; and the output of the comparison stage being coupled to the base of the transistor; and a shunt circuit having a second diode coupled across the resistor, the cathode of the second diode coupled to the control line.

2. An overload protection circuit for a semiconductor switch in accordance with claim 1, and further comprising:

a second capacitor connected in the shunt circuit in series with the second diode and a second resistor connected in parallel with the second diode, the second capacitor having a capacitance which is larger than that of the first capacitor.

* * * * *